Aug. 13, 1957 G. B. HERZOG 2,802,938

DIODE DETECTOR-TRANSISTOR AMPLIFIER CIRCUIT FOR SIGNAL RECEIVERS

Filed Jan. 28, 1954 2 Sheets-Sheet 1

INVENTOR.
GERALD B. HERZOG

BY
ATTORNEY

Aug. 13, 1957 G. B. HERZOG 2,802,938

DIODE DETECTOR-TRANSISTOR AMPLIFIER CIRCUIT FOR SIGNAL RECEIVERS

Filed Jan. 28, 1954 2 Sheets-Sheet 2

INVENTOR.
GERALD B. HERZOG

BY H. L. Newton

ATTORNEY

United States Patent Office 2,802,938

Patented Aug. 13, 1957

2,802,938

DIODE DETECTOR-TRANSISTOR AMPLIFIER CIRCUIT FOR SIGNAL RECEIVERS

Gerald B. Herzog, Princeton, N. J., assignor to Radio Corporation of America, a corporation of Delaware Application January 28, 1954, Serial No. 406,869

10 Claims. (Cl. 250—20)

This invention relates in general to signal receiving systems and in particular to systems of that type utilizing semi-conductor devices in the signal amplifying and translating portions.

Radio as well as television signal receivers, as is well known and understood, must provide some means of detecting or demodulating received signals. Thus, means must be provided for deriving from the carrier wave the original modulating signal which was applied at the transmitter. In the case of a carrier wave which has been amplitude modulated, the detector of the receiver must derive from the modulated carrier wave a voltage that varies in accordance with the modulation envelope. In the majority of instances this is accomplished by rectifying the modulated carrier wave.

Among the known types of signal detectors, for signal receivers employing electron emission tubes in the signal translating and amplifying portions, the diode rectifier is preferred for many applications and is used quite frequently. In the usual case, the diode is connected to the source of input signals so that it is effectively in series with a capacitor to provide a low impedance path at the carrier frequency. The conductive path for the rectified current is through a load element, such as a resistor, which allows the capacitor to discharge slowly. Thus, to realize the advantages afforded by the use of a separate diode rectifier as the detector, some sort of diode load circuit must be provided. The rectified load voltage is substantially free of carrier wave signals and may be either positive or negative with respect to ground. This load voltage is a linear reproduction of the carrier wave envelope when the carrier voltage is sufficiently high.

Recently, semi-conductor devices such as transistors have been the subject of extensive investigation for use in signal conveying equipment of all types. The signal translating and amplifying portions of radio signal receivers, in particular, have been found to be well adapted to transistors. In applying and adapting known electron tube receiver circuit principles to transistors, diode rectifiers have often been utilized as the signal detectors. Initially, the diode detector circuits for transistorized radio receivers have rather closely paralleled the known diode detector circuits for electron tube receivers. Thus, a separate diode load circuit has been considered necessary for proper operation of the detector.

It is also known that a transistor, if biased correctly, may be used as both an amplifier and detector in a radio signal receiver. While such an arrangement is simple, the frequencies at which such a circuit is able to detect signals is limited by the characteristics of the transistor used.

It is accordingly an object of the present invention to provide improved means in a signal receiving system for coupling a diode type detector with a semi-conductor amplifying device such as a transistor.

It is another object of the present invention to provide an improved and simplified diode detector circuit for a transistorized signal receiver, wherein a transistor amplifier provides the load circuit for the diode.

It is a still further object of the present invention to provide improved and efficient means for direct coupling a diode rectifier detector of a radio signal receiver to a transistor amplifier, wherein a separate load circuit for the diode rectifier is eliminated.

It is yet another object of the present invention to provide an improved transistorized signal receiver having a detector-amplifier circuit wherein signals of a relatively high frequency may be detected.

These and further objects and advantages of the present invention are achieved, in general, by connecting one of the electrodes of a diode rectifier detector with the input electrode of a transistor amplifier such that the transistor provides the load and output current path for the diode. Accordingly, a received signal will be rectified by the diode and the transistor will amplify the modulating signal. In addition to eliminating the separate load circuit for the diode, such an arrangement has also been found to exhibit a relatively broad frequency response.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
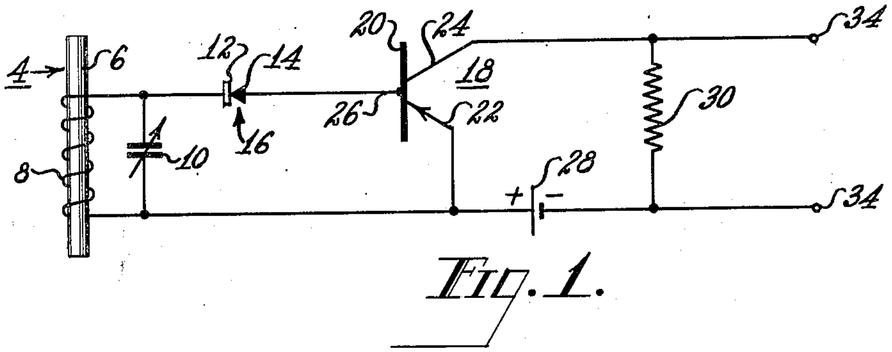
Figure 1 is a schematic circuit diagram of a diode rectifier and transistor amplifier connected in accordance with the invention.

Referring now to the drawing wherein like parts are indicated by like reference numerals throughout the figures, and referring particularly to Figure 1, a loop antenna 4 comprises a ferromagnetic core or rod 6 having a signal pickup winding 8 mounted thereon. The antenna winding 8 is tuned for response to an incoming signal by a variable capacitor 10 connected in shunt relation thereto as shown.

The upper end of the tuning capacitor 10 is connected to the cathode 12 of a diode rectifier 16, the anode 14 of which is connected, in accordance with the present invention, directly to the base or input electrode 26 of a semi-conductor amplifying device or transistor 18. Hence, the transistor 18 acts, in accordance with the invention, as a load for the diode 16. The transistor 18 includes a semi-conductive body 20 and two contacting electrodes—an emitter or common electrode 22 and a collector or output electrode 24, in addition to the base 26. The input circuit for the transistor is completed by connecting the lower end of the shunt tuning capacitor 10 to the emitter 22.

Operating potentials for biasing the transistor are obtained from any direct-current source of potential, such as illustrated by a battery 28, the positive terminal of which is connected with the emitter 24. The negative terminal of the biasing battery 28 is connected through a load resistor 30 to the collector 24. As shown, this is normal bias for a P-N-P junction transistor connected for amplifying action. Thus, the emitter is referred to as being biased in the relatively conducting or forward direction with respect to the base, while the collector is referred to as being biased in the reverse or relatively non-conducting direction with respect to the base.

Figure 2:
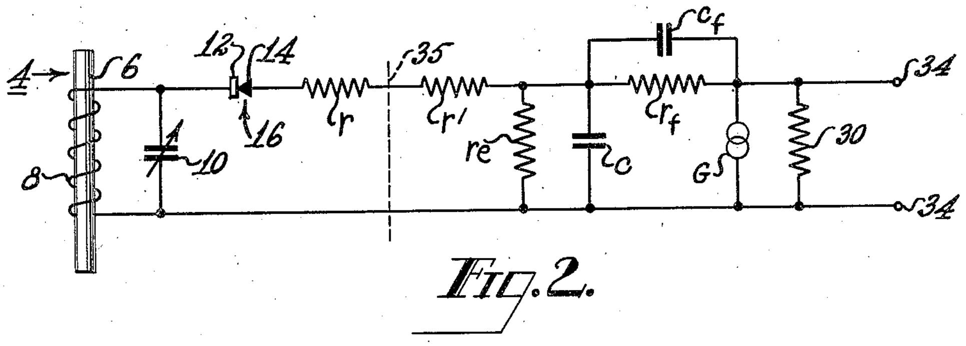
Figure 2 is an equivalent circuit diagram of the circuit illustrated in Figure 1.

While a P-N-P junction transistor has been used to illustrate the invention, it should not be considered restricted thereto as will be seen in connection with Figure 2. Thus, by reversing the polarity of the biasing battery 28, and the diode 16, an N-P-N transistor could be utilized equally well. In any case, the diode 16 should be connected with the base 26 so as to provide a low impedance path for current in combination with the base-emitter path of the transistor 18. Thus, it is seen that the diode 16 is poled for forward conduction in the same direction as the forward base current of transistor 18.

Output signals may be taken from a pair of terminals 34, one of which is connected to the upper end of the resistor 30 and the other of which is connected directly with the negative terminal of the battery 28.

In Figure 2, an equivalent circuit diagram for the circuit illustrated in Figure 1 includes a resistor $r$ which represents the lead resistance or so-called "spreading" resistance of the diode. The circuit elements to the right of the dotted line 35 represent the equivalent circuit for the transistor 18, and include a resistor $r'$ which represents the base lead resistance of the transistor 18. As shown, the resistors $r$ and $r'$ are connected in series, and may be considered to be a single resistor. The input impedance of the transistor may be represented by the resistor $r_e$ and the capacitor C, representing the input resistance and input capacitance, respectively, of the transistor.

As shown, the resistor $r_e$ and the capacitor C are connected in parallel with each other and with the lead resistance of the diode and transistor. Thus, the resistor $r_e$, which is the input resistance of the transistor, is also the load resistance for the diode rectifier 16, and the transistor 18 provides the load for the diode. Consequently, a separate load circuit is not required. The resistor $r_f$ and the capacitor $c_f$ represent the internal feedback resistance and capacitance of the semi-conductive body 20, while the generator G has an output proportional to the voltage across the resistor $r_e$. Therefore, the output voltage which appears at the output terminals 34 is an amplified replica of the voltage across the diode load.

As described, it is seen that a detector-amplifier circuit of the type utilizing a diode rectifier in accordance with the present invention utilizes a minimum number of circuit components. Hence, since the transistor 18 is the load for the diode 16, a separate load circuit is not required. In operation, an incoming carrier wave signal will be received by the antenna 4 and coupled through the winding 8 to the diode rectifier 16 where it will be rectified. The audio frequency signal will be amplified by the transistor 18. An amplified replica of the audio frequency signal will then be available at the output terminals 34.

Furthermore, it has been found that a detector-amplifier of the type described may be utilized to remove low frequency modulation signals from a carrier wave at frequencies which are in excess of one hundred megacycles. Thus, the utility of a circuit embodying the invention is not restricted to the detection of low frequency signals and it may find wide application in different types of signal receiving equipment.

In addition to the above advantages, the sensitivity of a detector-amplifier circuit of the type embodying this invention has been found to be excellent while at the same time the direct-current response is comparable to that of prior art detector circuits. This is of special importance in television receivers where a direct-current level is transmitted and must either be maintained throughout the various signal translating portions of the receiver or be reinserted before the video signal is applied to the kinescope. In most cases, direct-current coupling is preferred over direct-current reinsertion which generally requires the use of at least one extra electron emission tube. Thus, the present invention may find application in television receivers as well as radio receivers.

Figure 3:
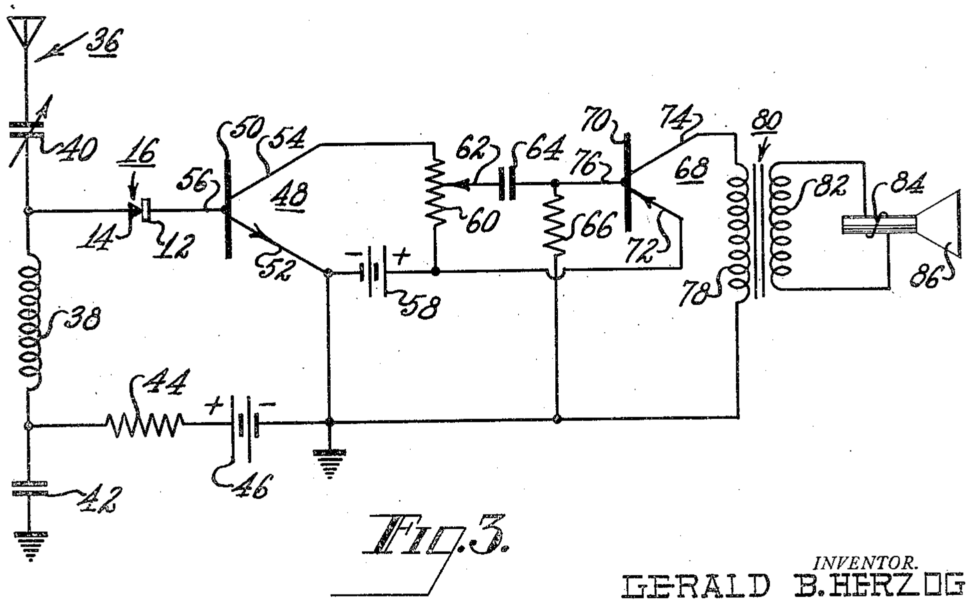
Figure 3 is a schematic circuit diagram of a three-stage radio signal receiver embodying the present invention.

Referring now to Figure 3, a radio signal receiver embodying the present invention includes a long wire antenna 36 with which are serially connected a variable tuning capacitor 40, an inductor 38, and a by-pass capacitor 42 to ground. The anode 14 of a diode rectifier 16 is connected to the junction of the tuning capacitor 40 and the inductor 38. The cathode 12 of the diode is connected, in accordance with the present invention, directly with the base or input electrode 56 of an N-P-N junction transistor 48 which acts as an audio frequency amplifier for the receiver. As in Figure 1, the diode 16 provides a low impedance path in combination with the base-emitter path of the transistor 48, and is poled for forward conduction in the same direction as the forward base current of the transistor.

The transistor 48 includes, in addition to the base electrode 56 a semi-conductive body 50 and two additional electrodes which are in contact with the body 50 and are designated as an emitter or common electrode 52 and a collector or output electrode 54. To complete the input circuit for the transistor 48, the emitter 52 is connected to a point of fixed reference potential or ground for the system, and a serially connected biasing battery 46 and a resistor 44 are connected between the emitter 52 and the junction of the inductor 38 and the capacitor 42.

The collector 54 of transistor 48 is connected through an output resistor 60 to the positive terminal of a further biasing battery 58, the negative terminal of which is connected to ground as shown. Thus, the N-P-N junction transistor 48 is seen to be properly biased for amplifier action.

To provide volume control for the receiver, the resistor 60 is provided with a variable tap 62. The tap 62 is connected through a direct-current blocking capacitor 64 to the base 76 of a second audio frequency transistor amplifier 68. The base 76 is also connected through a biasing resistor 66 to ground.

The second transistor amplifier 68 which is of the P-N-P type, includes, in addition to the base 76, a semi-conductive body 70, and a collector 74 and an emitter 72 each in contact with the body 70. The emitter 72 is connected to, for biasing purposes, the positive terminal of the battery 58.

To provide an output circuit for the transistor amplifier 68, the collector 74 is connected in series with the primary winding 78 of an output transformer 80, the other end of which is connected to ground. The secondary winding 82 of the output transformer 80 is connected to any suitable utilization means such as illustrated by the voice coil 84 of a loudspeaker 86.

In operation, an incoming signal, when picked up by the antenna 36 is coupled to the diode rectifier 16, which rectifies the signal in a well known manner. The audio frequency signal will then be amplified by the transistor 48 which also acts, in accordance with the invention, as a load for the diode.

The amplified audio frequency signal will be coupled through the capacitor 64 to the base 76 of the second transistor amplifier 68. Amplified audio frequency signals appearing on the collector 74 of the transistor 68 will be coupled through the transformer 80 to the voice coil 84 of the loudspeaker. Thus, a simple yet efficient and reliable radio signal receiver has been shown and described.

Figure 4:
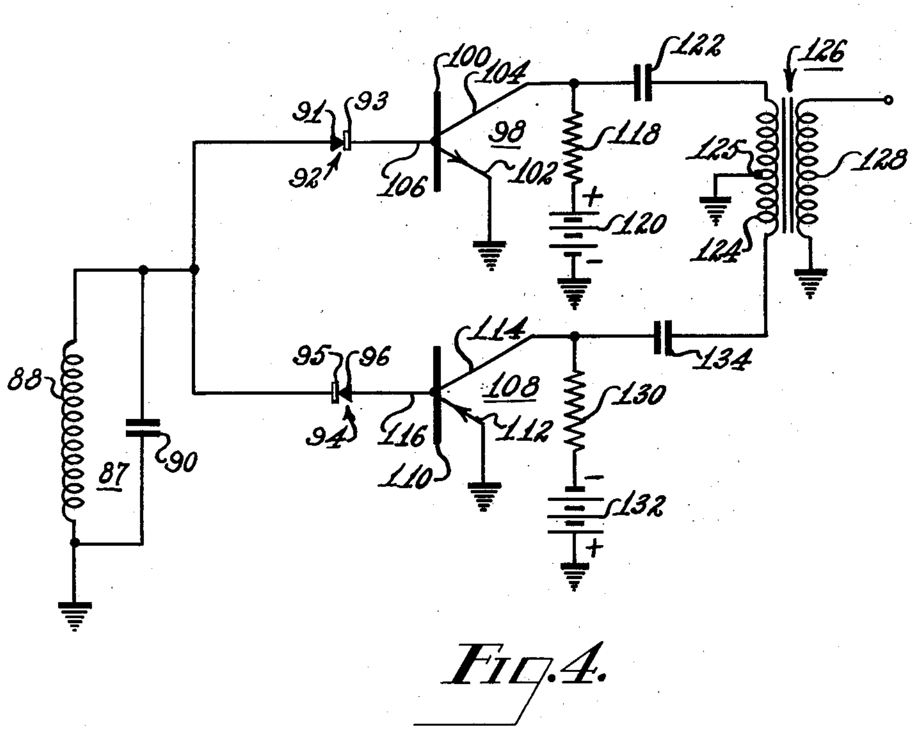
Figure 4 is a schematic circuit diagram of a detector-amplifier circuit utilizing a pair of diodes and transistors, respectively, in accordance with the present invention.

To increase the output of the diode-amplifier circuit and to provide a balanced load for the input signal source, in accordance with the invention, two diode-rectifiers and two opposite conductivity type transistor amplifiers may be utilized as shown in Figure 4. To this end a signal input circuit 87 which comprises, for example, an inductor 88 and a parallel capacitor 90 is grounded at one end and has its other end connected to the junction of a pair of diode rectifiers 92 and 94. The diode rectifier 92 includes an anode 91 and a cathode 93 which is connected directly with the base 106 of an N–P–N junction transistor 98. The transistor 98, in accordance with the invention, acts as the load for the diode 92 and comprises a semi-conductive body 100 and three contacting electrodes which are designated as an emitter 102, a collector 104 and a base 106.

Similarly, the diode rectifier 94 also includes a cathode 95 and an anode 96. The anode 96 of the diode is connected directly with the base 116 of a P–N–P junction transistor 108 in accordance with the invention—the transistor 108 consequently serving as the load for the diode rectifier 94. The transistor 108 further includes a semi-conductive body 110 and two contacting electrodes in addition to the base 116—namely, an emitter 112 and a collector 114. As shown the emitters 102 and 112 of the respective transistors 98 and 108 are connected to a point of fixed reference potential or ground for the system. Hence, the transistors 98 and 108 are seen to be connected to operate in push-pull relation.

To properly bias each of the transistors 98 and 108, their respective collectors 104 and 114 are connected through biasing resistors 118 and 130 to the positive and negative terminals respectively of a pair of biasing batteries 130 and 132, the other terminals of which are connected to ground. Thus, each of the collectors, since the transistors 98 and 108 are of opposite conductivity types, will be biased in a relative non-conducting or reverse direction with respect to their respective base electrodes 106 and 116. This, as is well known, is normal bias for transistor amplifying action.

Each of the collectors 104 and 114 of the respective transistors 98 and 108 are also connected through coupling capacitors 122 and 134 to either end of the primary winding 124 of an output transformer 126. Alternately, the collectors 104 and 114 may be connected with the input electrodes of a pair of push-pull amplifiers. The primary winding 124 has a center tap 125 which is connected to ground. A single-ended push-pull output signal is obtained from the secondary winding 128 of the output transformer 126, one terminal of which is grounded as shown.

Because current flows on both negative and positive half cycles of applied signal, a balanced load is provided for the source of input signals. Furthermore, by using two diodes and two transistor amplifiers substantially twice the power is obtainable than when a single diode rectifier and transistor amplifier are used. Furthermore, other inherent advantages of push-pull amplifiers, such as the cancellation of even order harmonic distortion will be realized when a circuit of the type illustrated in Figure 4 is utilized. Since the transistors provide the load circuit for each of the diodes no separate load impedances are needed. Thus, the circuit illustrated in Figure 4 combines efficiency with circuit simplicity.

As mentioned above, the conductivity type of the specific transistors utilized is not critical so long as the polarity of the biasing source is correct. Thus, either N–P–N or P–N–P junction transistors, or any other semiconductor amplifier exhibiting similar characteristics may be utilized.

Furthermore, the invention is not restricted to receivers utilizing a single detector and may be used as a second detector in a superheterodyne signal receiver for example.

What is claimed is:

1. In a signal receiver, the combination comprising, a transistor having a base, an emitter and a collector electrode, energizing means connected for biasing said electrodes, and signal detection means for said receiver including a diode rectifier serially connected with said base electrode, wherein the base-emitter path of said transistor provides the sole output current path for said diode rectifier and wherein said diode rectifier is poled for forward conduction in the same direction as the base current of said transistor.

2. In combination with a signal receiver including cascade connected semi-conductor amplifier stages, one of said stages including a junction transistor having a base, an emitter and a collector electrode, energizing means including a source of potential for applying biasing potentials to said electrodes, a signal output circuit connected with said collector electrode, signal detection means for said signal receiver including a diode rectifier, said diode rectifier being poled for forward conduction in the same direction as the forward base current of said transistor, a signal input circuit for said signal detection means, and conductive means connected to form a single electrical loop comprising said input circuit, said signal detection means and the base-emitter path of said transistor.

3. A signal receiver as defined in claim 2 wherein said transistor is of the P–N–P junction type and said diode rectifier includes an anode and a cathode, said anode being directly connected with the base electrode of said transistor.

4. A signal receiver as defined in claim 2 wherein said transistor is of the N–P–N junction type and said diode rectifier includes an anode and a cathode, said cathode being directly connected with the base electrode of said transistor.

5. In a radio signal receiver including semi-conductor amplifying means having an input, an output and a common electrode, the combination comprising signal detection means for said receiver including a unilateral conducting device, and means directly coupling said device with said input electrode, said unilateral conducting device providing a low impedance path in combination with the input-common electrode path of said semi-conductor amplifying means wherein the input-common electrode path of said amplifying means provides the sole output current path for said device.

6. In combination with a radio signal receiver including cascade connected semi-conductor amplifier stages, one of said stages including a semi-conductor device having a base, an emitter and a collector electrode, energizing means including a source of potential for applying biasing potentials to said electrodes, and signal detection means for said receiver including a diode rectifier directly connected with said base electrode, said diode rectifier providing a low impedance path in combination with the base-emitter path of said semi-conductor device wherein the base-emitter path of said device provides the sole output current path for said diode rectifier.

7. In a radio signal receiver, the combination comprising, signal detection means for said receiver including a diode rectifier, a signal input circuit for said signal detection means, signal amplifying means providing a load circuit for said dode rectifier including a junction transistor having a base, an emitter and a collector electrode, means including a source of voltage for applying biasing potentials to said electrodes, a signal output circuit connected with said collector electrode, and conductive means directly connecting said diode rectifier with said base electrode to form a single electrical loop comprising said input circuit, said signal detection means, and the base-emitter path of said transistor, said diode rectifier providing a low impedance current path in combination with the base-emitter path of said transistor.

8. In a signal receiving system, the combination comprising, signal detection means for said system including a first and a second diode rectifier, signal amplifying means providing a load circuit for each of said diodes including a first and a second signal amplifying semiconductor device connected for push-pull operation, each of said devices having a base, an emitter, and a collector electrode, means directly connecting said first diode rectifier with the base electrode of said first device wherein said first device provides the load circuit and the sole output current path for said first diode rectifier, and means directly connecting said second diode rectifier with the base electrode of said second device wherein said second device provides the load circuit and the sole output current path for said second diode rectifier.

9. A signal receiving system as defined in claim 8 wherein said first and second semi-conductor devices are of opposite conductivity types and wherein said first and second diode rectifiers are poled for forward conduction in the same direction as the respective forward base current of said first and second semi-conductor devices.

10. In a signal receiver, the combination comprising, a transistor having a base, an emitter, and a collector electrode, signal detection means for said receiver including a diode rectifier, and means direct-current conductively connecting said diode rectifier with the base electrode of said transistor wherein the conductive path defined by the base and emitter electrodes of said transistor provides the load and sole output current path for said diode rectifier.

References Cited in the file of this patent

UNITED STATES PATENTS

| | | |
|---|---|---|
| 2,248,521 | Blue | July 8, 1941 |
| 2,550,518 | Barney | Apr. 24, 1951 |
| 2,569,687 | Pan | Oct. 2, 1951 |
| 2,662,976 | Pantchechnikoff | Dec. 15, 1953 |

FOREIGN PATENTS

| | | |
|---|---|---|
| 203,284 | Great Britain | Mar. 10, 1924 |

OTHER REFERENCES

Article: "A crystal receiver with transister amplifier" by Turner, Radio & Television News, January 1950; pp. 38, 39, 153, 154, 155, of which only page 39 is relied upon.

Article: "A portable transistor F-M-Receiver" by Ballard, pp. 79, 206 and 207 of Tel-Tech and Electronic Industries, August 1953.

Article: "Single transistor R 1–7" by Knight, page 225 of Wireless World, May 1954.